(12) United States Patent
Nelson et al.

(10) Patent No.: US 7,789,674 B2
(45) Date of Patent: Sep. 7, 2010

(54) MOLDED CARD EDGE CONNECTOR FOR ATTACHMENT WITH A PRINTED CIRCUIT BOARD

(75) Inventors: Stephen T. Nelson, Santa Clara, CA (US); Donald A. Ice, Milpitas, CA (US); Darin James Douma, Monrovia, CA (US)

(73) Assignee: Finisar Corporation, Sunnyvale, CA (US)

( * ) Notice: Subject to any disclaimer, the term of this patent is extended or adjusted under 35 U.S.C. 154(b) by 265 days.

(21) Appl. No.: 12/114,600

(22) Filed: May 2, 2008

(65) Prior Publication Data

US 2008/0318478 A1    Dec. 25, 2008

Related U.S. Application Data

(60) Provisional application No. 60/915,549, filed on May 2, 2007.

(51) Int. Cl.
*H01R 12/00* (2006.01)
(52) U.S. Cl. .......... 439/76.1; 439/931; 439/65; 439/620.22
(58) Field of Classification Search ............. 439/76.1, 439/65, 620.22, 931
See application file for complete search history.

(56) References Cited

U.S. PATENT DOCUMENTS

| | | | | |
|---|---|---|---|---|
| 4,812,275 A | * | 3/1989 | Yumoto | 264/129 |
| 4,908,259 A | * | 3/1990 | Yumoto | 428/209 |
| 4,969,842 A | * | 11/1990 | Davis | 439/629 |
| 5,015,519 A | * | 5/1991 | Yumoto | 428/209 |
| 5,098,769 A | * | 3/1992 | Nakai et al. | 428/195.1 |
| 5,108,295 A | * | 4/1992 | Koike et al. | 439/79 |
| 5,219,292 A | * | 6/1993 | Dickirson et al. | 439/67 |
| 5,626,483 A | * | 5/1997 | Naitoh | 439/74 |
| 5,938,455 A | * | 8/1999 | Glovatsky et al. | 439/74 |
| 6,200,146 B1 | * | 3/2001 | Sarkissian | 439/79 |
| 6,375,512 B1 | * | 4/2002 | Zito et al. | 439/660 |
| 7,286,372 B2 | * | 10/2007 | Aronson et al. | 361/818 |
| 7,452,217 B2 | * | 11/2008 | Yoshizawa et al. | 439/83 |
| 7,476,124 B2 | * | 1/2009 | Mewes et al. | 439/495 |
| 2004/0104040 A1 | * | 6/2004 | Schauz | 174/250 |
| 2007/0298630 A1 | * | 12/2007 | Yoshizawa et al. | 439/83 |
| 2008/0160828 A1 | * | 7/2008 | Dangelmaier et al. | 439/577 |
| 2009/0163045 A1 | * | 6/2009 | Peloza et al. | 439/55 |
| 2009/0215287 A1 | * | 8/2009 | Mori et al. | 439/74 |
| 2009/0311884 A1 | * | 12/2009 | Ono et al. | 439/65 |
| 2009/0321122 A1 | * | 12/2009 | Mori et al. | 174/261 |

* cited by examiner

*Primary Examiner*—Ross N Gushi
(74) *Attorney, Agent, or Firm*—Workman Nydegger

(57) ABSTRACT

An edge connector suitable for attachment with a printed circuit board. The edge connector comprises a body composed of a plastic resin, the body defining a first end that is configured to operably attach to a portion of a printed circuit board and a second end configured to operably connect to a slot in a host device and a plurality of conductive traces and contact pads defined on a portion of a surface of the body, the traces being configured to electrically connect with corresponding traces defined on the printed circuit board.

13 Claims, 5 Drawing Sheets

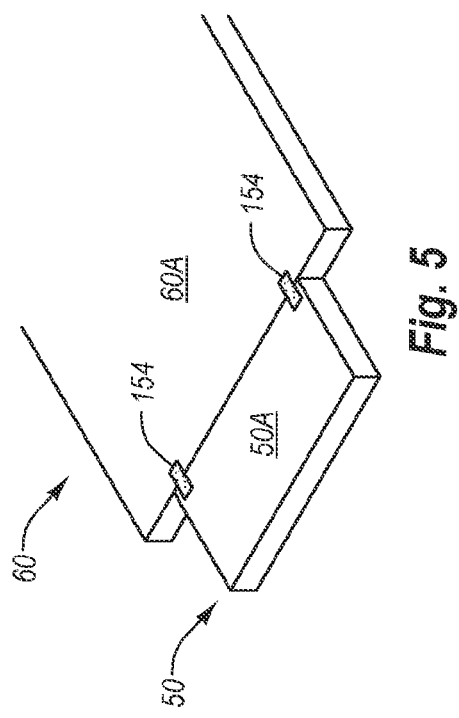
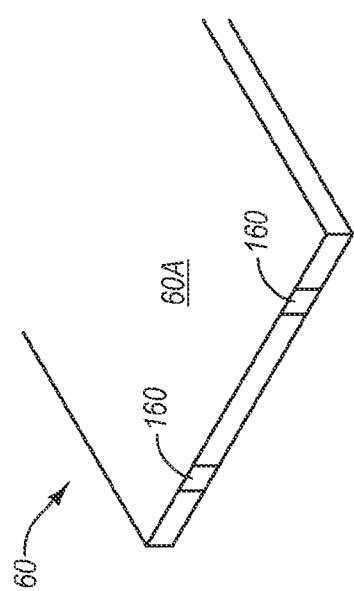
Fig. 5
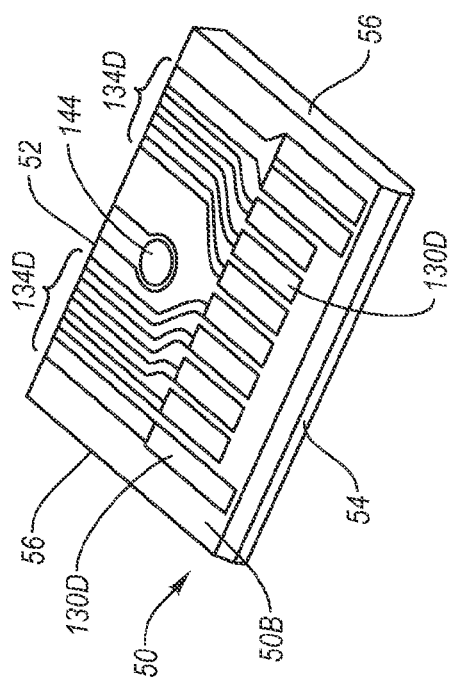
Fig. 3
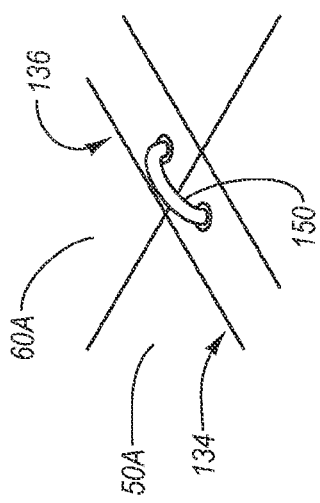
Fig. 6
Fig. 4

MOLDED CARD EDGE CONNECTOR FOR ATTACHMENT WITH A PRINTED CIRCUIT BOARD

CROSS-REFERENCE TO RELATED APPLICATIONS

This application claims the benefit of U.S. Provisional Application No. 60/915,549, filed May 2, 2007, which is incorporated herein by reference in its entirety.

BACKGROUND

Multi-source agreements, or "MSAs" govern many aspects of the design of a communications module, such as an optical transceiver module. One MSA-governed aspect relates to the card edge connector of the transceiver, which enables electrical interconnection of the transceiver with a host device. Some MSA-defined parameters of a card edge connector include the width of the connector and the distance between the connector edge and nearest conductive feature included on the connector surface. In the latter case, for instance, the distance between a conductive feature such as a conductive trace and the nearest edge of the connector must fall within a tight tolerance such as 0.1 mm, according to applicable MSAs.

Card edge connectors for use in optical transceiver modules are typically formed integrally as part of a printed circuit board. Printed circuit boards having card edge connectors complying with such tight tolerances are difficult to produce as a matter of course. Thus, due to these tight tolerances, the production of printed circuit boards with edge connectors typically results in one of two possible undesirable consequences. One possible consequence is that most printed circuit boards having card edge connectors are manufactured out of compliance with MSA-defined tolerances which may cause intermatability problems. Alternatively, it is possible to produce a card edge connector-compliant printed circuit board, but only at a high cost with low yield, resulting in a four-fold or more increase in production cost over typical boards.

Thus, a need exists in the art for printed circuit boards and other circuit or electronic platforms that include card edge connectors having dimensions that fall within the restrictive tolerances of applicable MSAs. A further need exists for the production of such card edge connectors at a relatively low cost while maintaining acceptable yields.

BRIEF SUMMARY

An embodiment disclosed herein relates to an edge connector suitable for attachment with a printed circuit board. The edge connector comprises a body composed of a plastic resin, the body defining a first end that is configured to operably attach to a portion of a printed circuit board and a second end configured to operably connect to a slot in a host device; and a plurality of conductive traces and contact pads defined on a portion of a surface of the body, the traces being configured to electrically connect with corresponding traces defined on the printed circuit board.

An additional embodiment disclosed herein relates an edge connector suitable for attachment with a printed circuit board. The edge connector comprises a body composed of a plastic resin, the body defining a first end that is configured to operably attach to a portion of a printed circuit board and a second end configured to operably connect to a slot in a host device; a plurality of conductive traces and contact pads defined on a portion of a surface of the body, the traces being configured to electrically connect with corresponding traces defined on the printed circuit board; and at least one interconnection mechanism defined in the first end configured to connect the edge connector with the printed circuit board.

A further embodiment disclosed herein relates to an edge connector suitable for attachment with a printed circuit board. The edge connector comprises an injection molded body, the body composed of a plastic resin containing a palladium catalyst, the body defining a first end that is configured to operably attach to a portion of a printed circuit board and a second end configured to operably connect to a slot in a host device; a plurality of conductive traces and contact pads defined on a portion of a surface of the body, the surface portion whereon the traces and contact pads are defined having been previously laser etched, the traces being electrically connected with corresponding traces defined on the printed circuit board; and at least two reference features defined by the body, the reference features for use in defining the conductive traces and pads on a portion of the body surface.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teaching herein. The features and advantages of the teaching herein may be realized and obtained by means of the instruments and combinations particularly pointed out in the appended claims. These and other features will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only illustrated embodiments of the invention and are therefore not to be considered limiting of its scope. The invention will be described and explained with additional specificity and detail through the use of the accompanying drawings in which:

FIG. 3 is a perspective view of the bottom of the molded edge connector of FIG. 2A;

FIG. 4 is a close-up view of a wirebond used to electrically couple traces of the molded edge connector and the printed circuit board;

FIG. 5 shows one manner for securing the molded edge connector to the printed circuit board, according to one embodiment;

FIG. 6 shows various features of another option for securing the molded edge connector to the printed circuit board, according to one embodiment.

DETAILED DESCRIPTION

Reference will now be made to figures wherein like structures will be provided with like reference designations. It is understood that the drawings are diagrammatic and schematic representations of exemplary embodiments of the invention, and are not limiting of the present invention nor are they necessarily drawn to scale. It is also understood that reference to a "first", or a "second" etc. element in this description and in the claims is meant to distinguish one element from another and is not meant to imply sequential ordering unless explicitly stated.

FIGS. 1-7 depict various features of embodiments of the present invention, which are generally directed to a card edge connector for use with circuit boards or other electronic platforms that mate with a host device. In one embodiment, the card edge connector operates with a printed circuit board that is included in a communications module, such as an optical transceiver module. The edge connector enables the printed circuit board, and thus the transceiver module, to electrically connect with the host device.

In particular, the edge connector is not integrally formed with the printed circuit board, but is attached thereto. Moreover, the edge connector is a molded connector formed by a 3-D MID process and including conductive features formed by a laser etching process. Importantly, the molded edge connector can be manufactured with a precision process that ensures that critical dimensions are formed within the tolerances demanded by applicable MSAs.

Figure 1:
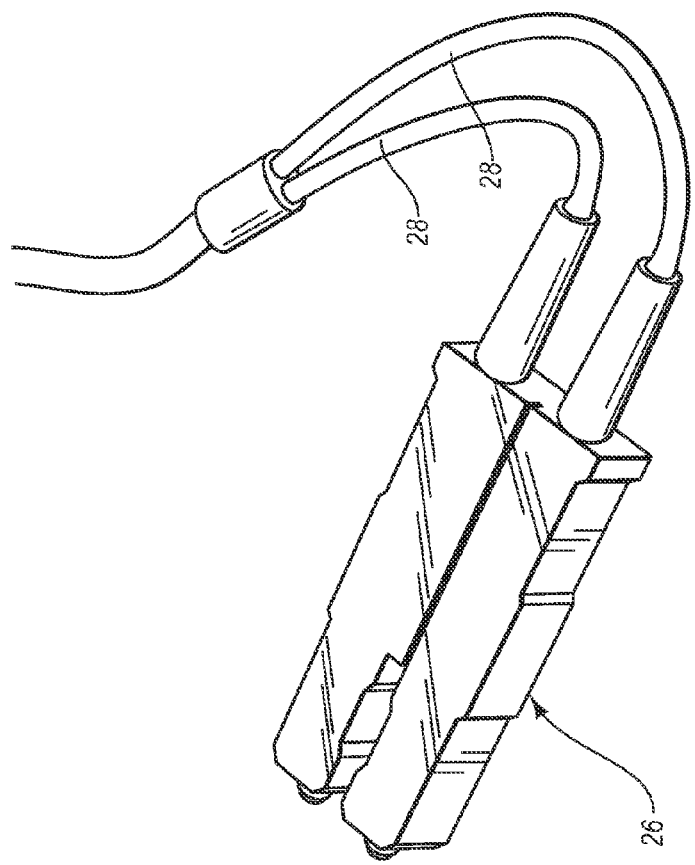
FIG. 1 is a perspective view of an optical transceiver module incorporating features of the present invention according to one embodiment.
Figure 1:
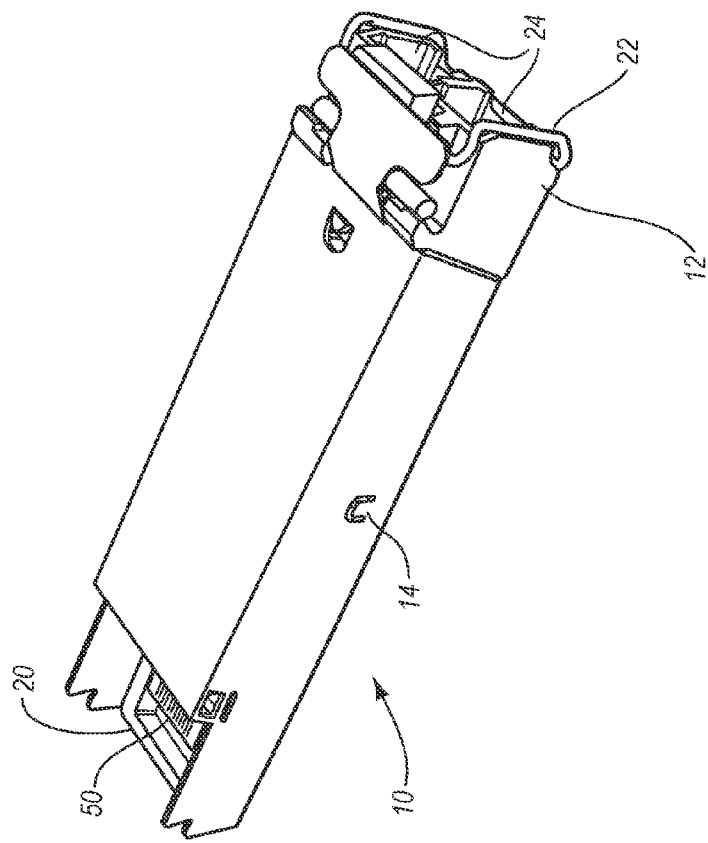

Reference is first made to FIG. 1, which shows one exemplary environment in which embodiments of the present invention can be practiced. In detail, FIG. 1 includes an optical transceiver module ("transceiver"), generally designated at 10, which contains one embodiment of the molded edge connector to be described herein. The transceiver 10 includes a body 12 and a shell 14 that cooperate to form an outer covering for interior elements of the transceiver. One interior element of the transceiver 10 is a printed circuit board ("PCB") to be described further below. The PCB is mated with a card-edge connector, generally designated at 50, that extends from a first open end 20 of the transceiver 10 for electrically interfacing with a connector receptacle of a host device (not shown). More details regarding the edge connector 50 are given below.

A second open end 22 of the transceiver 10 includes dual optical ports 24 that selectively receive a duplex optical connector 26 that is in turn connected with a pair of optical fibers 28.

As shown, the transceiver 10 is implemented as having a form factor and configuration conforming to a Small Form Factor Pluggable ("SFP") standard, as defined by applicable Multi-Source Agreements ("MSAs") standard in the industry. However, it should be noted that transceivers and other communications modules that differ in form factor, operational configuration, or other aspects can also benefit from the principles discussed herein. Indeed, modules such as 10 Gigabit Small Form Factor Pluggable ("XFP") or "X2" transceivers having varying form factors and data rates can also employ features of the embodiments to be described herein. The following discussion is therefore not meant to limit the scope of the present invention in any way.

Figure 2A:
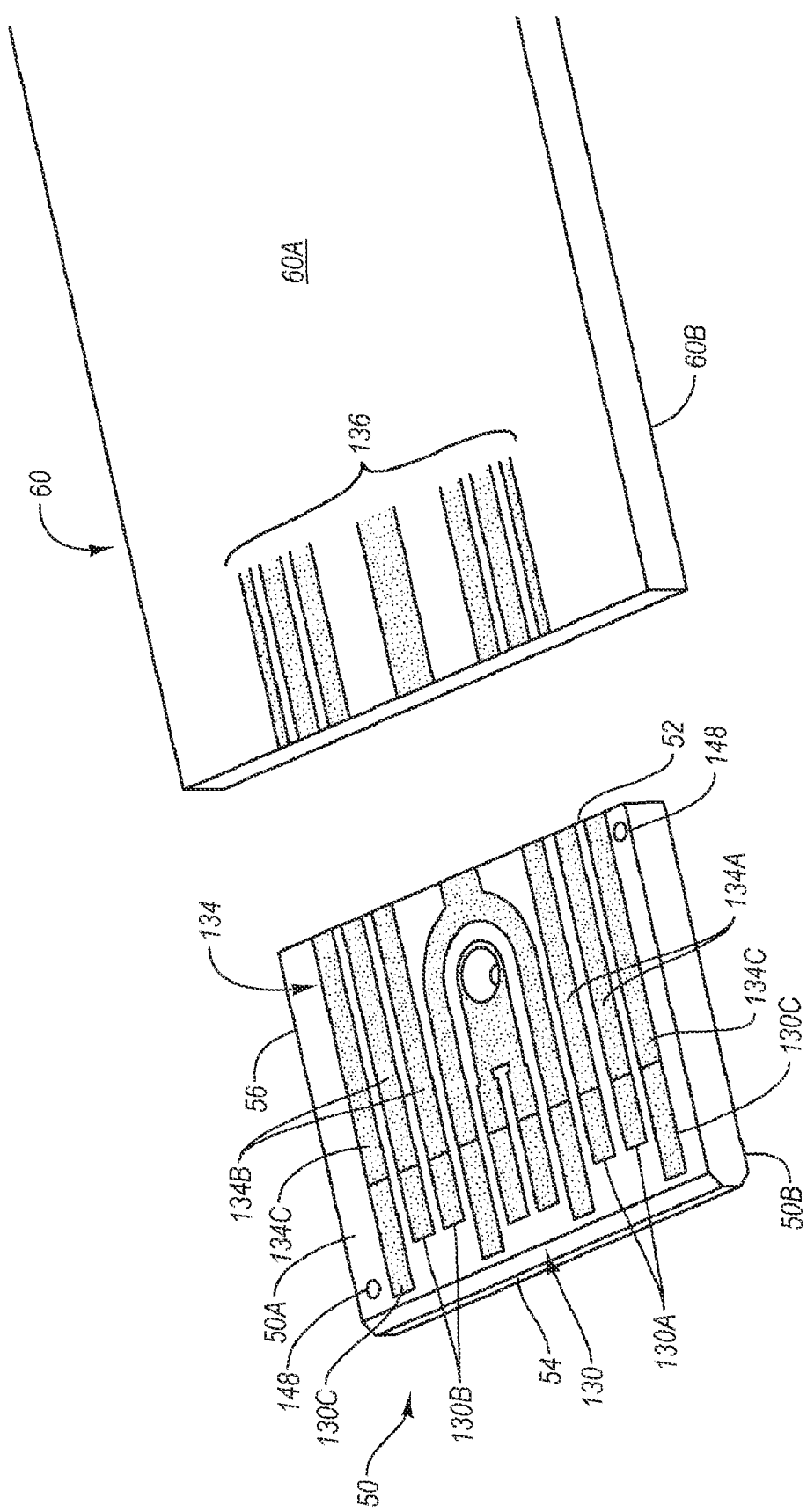
FIG. 2A is a perspective exploded view of a molded edge connector for mating with a printed circuit board, according to one embodiment of the present invention.
Figure 2B:
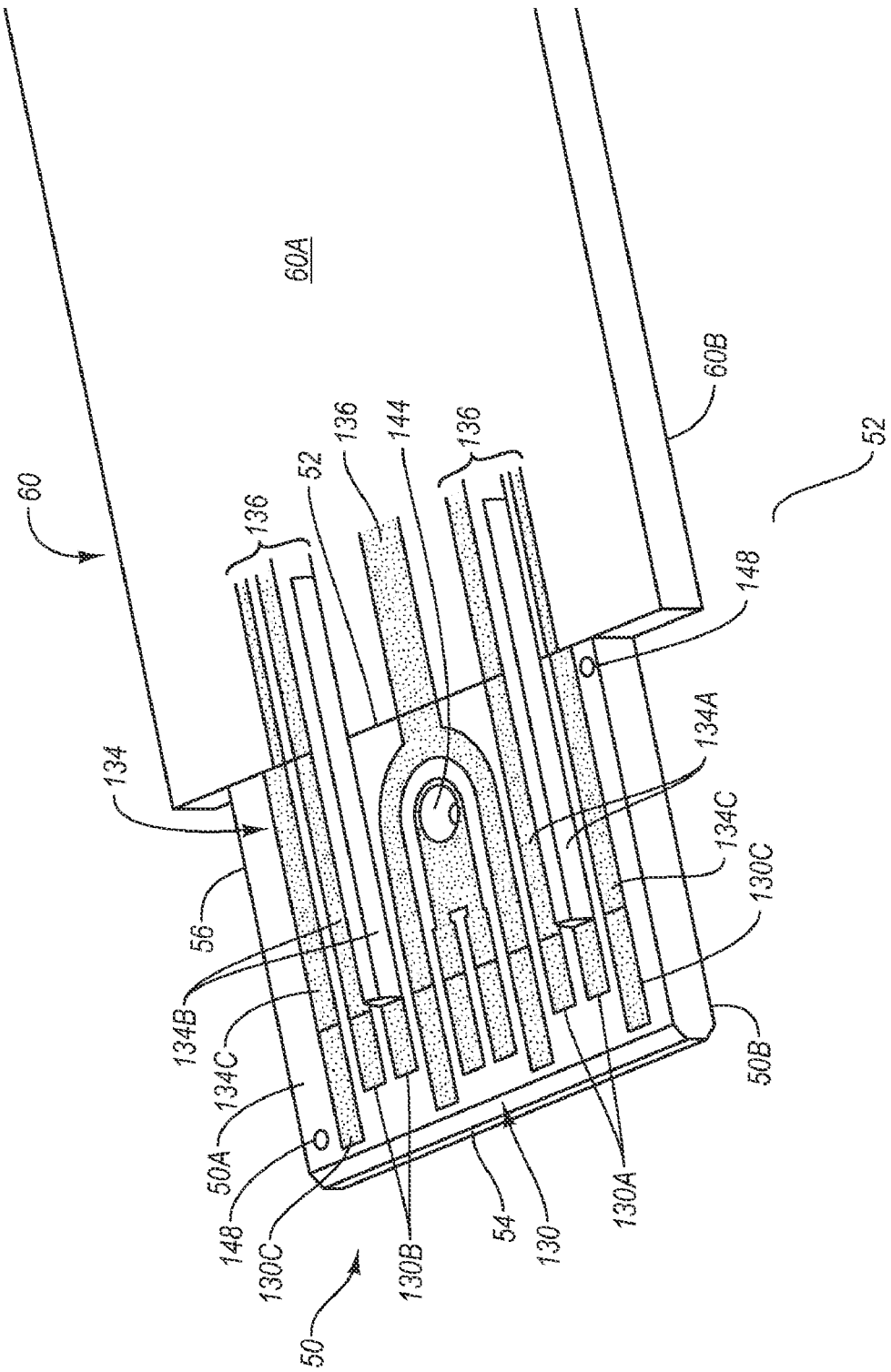
FIG. 2B is a perspective mated view of the molded edge connector and printed circuit board of FIG. 2A, according to one embodiment.

Reference is now made to FIGS. 2A and 2B in describing various features of the molded edge connector ("connector") 50, according to one embodiment. In particular, these figures show the connector 50 both in an un-mated and mated configuration with respect to a printed circuit board 60, described above as residing within the transceiver 10 of FIG. 1. As shown, the connector 50 includes a body that is formed by standard injection molding or other suitable molding process. As such, the connector body is also referred to herein as a "molded module."

The connector body is composed of a suitable material to enable the formation of conductive features on the body in the manner described below. In one embodiment, the connector body is composed of a plastic resin, such as a liquid crystal polymer, having a catalyst intermixed therewith. In one embodiment, the catalyst is composed substantially of palladium, but other suitable materials offering the same functionality could alternatively be used. As mentioned, this material composition for the transceiver body enables conductive features to be defined on the body, as will be described further below.

The body of the connector 50 defines a top surface 50A and bottom surface 50B, as well as a front end 52 and back end 54. The connector front end 52 mates with a corresponding end of the PCB 60 as shown in FIG. 2B, while the connector back end 54 is the first portion of the connector 50 that is received into a corresponding slot defined in a host system (not shown), enabling the PCB 60 to operably connect with the host device. In this way, operable interconnection between the transceiver 10 and the host system can be achieved.

Together with FIGS. 2A and 2B, reference is now made to FIG. 3, showing various further details of the connector transceiver 100. A plurality of contact pads 130 are included on both the top and bottom surfaces 50A and 50B of the edge connector 50 for interfacing with corresponding pads or conductive features of the host device (not shown). Among these pads are disposed a first data signal pad pair 130A and a second data signal pad pair 130B that each facilitate the transfer of high speed data signals between the host device and the transceiver 100. Additionally, a plurality of conductive traces 134 are also included on the connector top surface 50A that extend between the corresponding contact pads 130 and the first end 52 of the connector 50 to enable the transfer of signals between the contact pads and conductive traces 136 disposed on the PCB tope surface 60A. The manner of electrical connection between the traces 134 of the connector 50 and the traces 136 of the PCB 60 is discussed further below.

In greater detail the traces 134 include a first data signal trace pair 134A and a second data signal trace pair 134B that each operably connect with the corresponding first or second data signal pad pairs 130A or 130B of the connector 50. Also included are ground traces 134C that operably connect with corresponding ground contact pads 130C on the edge connector 50. Similarly, the connector bottom surface 50B includes traces 134D that extend between corresponding contact pads 130D and traces disposed on the PCB bottom surface 60B.

The conductive contact pads 130 and traces 134 are defined on the surfaces of the connector by a process known as laser direct structuring, wherein a guided laser is employed during transceiver body manufacture in etching the surfaces of the connector body where conductive features such as the contact pads and traces are to be located. Laser etching in this manner removes several microns of the plastic resin body material at the surface thereof, which exposes and activates the palladium catalyst imbedded in the plastic resin. So prepared, placement of the connector body in an electroless plating bath causes copper or other suitable component of the bath to adhere to the laser etched portions of the body, thereby forming the contact pads 130, traces 134, and other desired conductive features on the connector.

Formation of conductive features on a catalyst-containing plastic resin using the laser direct structuring process as described above yields a product also known as and referred to herein as a "plastic circuit." This process and technology is owned and licensed by LPKF Laser and Electronics AG, Germany, http://www.lpkf.com/. Products formed by this process are generally known as molded interconnect devices ("MIDs").

Should the particular path, shape, or other configuration of the contact pads 130, traces 134, or other conductive features need to be altered for a connector yet to be manufactured, the laser need simply be reprogrammed to etch the body surface in accordance with the desired change. In this way, reconfiguration of the conductive features on the connector body is readily achieved without significant expense or time.

In accordance with embodiments of the present invention, the body of the connector 50 can be configured to include various surface features serving various purposes for the connector. These surface features give the connector body a three dimensional ("3-D") aspect that is not possible with known edge connectors integrally formed as a part of standard printed circuit boards ("PCBs"). A connector configured to include a 3-D feature as described below is also referred to herein as a "3-D MID."

One example of a 3-D feature of the connector 50 is shown at 144 in FIGS. 2A-3 wherein a hole, or via, is defined through the body so as to extend from the top connector surface 50A to the bottom surface 50B. The via 144 enables signals transmitted on selected traces 134 to be transferred from one body surface to another. Note that the interior surface of the via 144 is slanted with respect to the top and bottom connector surfaces 50A, B. This is to enable sufficient laser etching to be performed on the via 144 so that a conductive material may be applied thereto. Generally, the slant of such surfaces should be no greater than about 75 degrees from a plane defined by the top or bottom connector surface 50A or 50B. More generally, the slant is determined by the requirements of the particular laser etching equipment used. Note that many such vias can be defined in the connector body, if needed.

As yet another example of 3-D featuring of the connector, a plurality of vertical ridges, as illustrated in FIG. 2B, can be defined on the top and/or bottom connector surfaces so as to enable conductive traces 134 of the connector to be defined thereon. The traces 134 can be disposed on opposing sides of the respective ridge. This configuration enables the traces 134 of each pair to effectively couple with one another, thereby controlling their respective impedance, i.e., creating a differential impedance known as "broadside coupling," and preserving the quality of the data signals transmitted therethrough. Such a configuration compensates for the fact that no ground exists in the connector body as would typically exist for coupling purposes in a standard printed circuit board. In addition, the ridge and its respective traces could be positioned in a trough defined in the surface of the connector body so as to not violate the MSA-defined thickness requirements of the edge connector.

Figure 7:
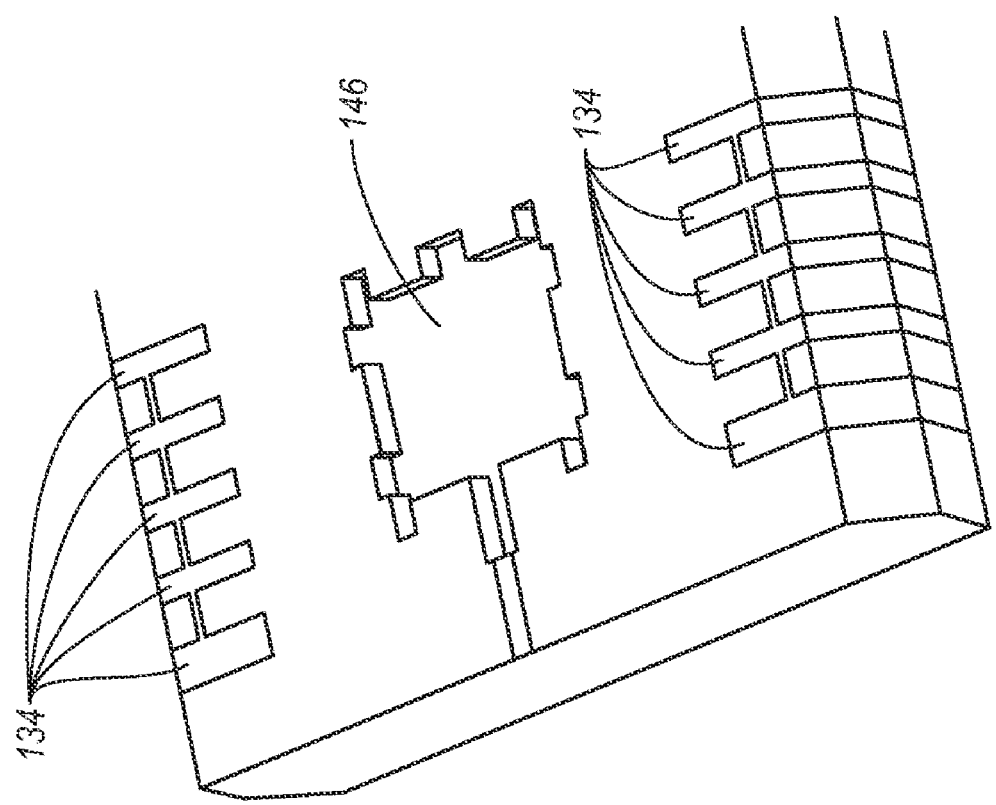
FIG. 7 is a perspective view of an alternative embodiment of a molded edge connector, according to the principles of the present invention.

Referring to FIG. 7, an alternative view of a connector 50 is shown that illustrates additional 3-D features in accordance with the principles of the present invention. For example, a component pocket 146 may be defined in a surface of the connector 50 as yet another 3-D feature made possible by the 3-D MID connector configuration described herein, in accordance with one embodiment. The component pocket 146 can be sized and configured to receive therein an integrated circuit chip or other electronic or optoelectronic component. The floor of the component pocket 146 can include a conductive pad configured to electrically connect with the component contained therein. The conductive pad can in turn be electrically connected to one or more traces that extend to the component pocket 146 so as to provide electrical signaling.

Note that, because the component pocket 146 would be sunken with respect to the top or bottom surface of the connector, a component when placed in the pocket is positioned substantially level with the connector surface. This enables electrical connections of minimum length, such as wirebonds, to be established between the traces that terminate at the component pocket and the component. As improved signal transmission is achieved with wire bonds when the wire bond length is minimized, the minimization of length between the terminations of the traces proximate the component pocket and the component located in the component pocket would advantageously operate to improve signal transmission—especially high frequency signals—between the two structures. Once placement, securing, and wire bonding of the component within the component cavity is complete, the controller could be covered with epoxy to prevent damage to the component or wire bonds.

Note that one or more component pockets 146 having varying sizes, depths, and particular configurations can be disposed at various locations on the top and bottom body surfaces of the connector as may be needed for a particular application. Further, more than one component may be received in each component pocket 146.

Again referring to FIG. 7, it is shown that in some embodiments, the traces 134 disposed on the connector top and bottom surfaces 50A and 50B can pass between the bottom and top surfaces and around the edges of the connector if desired. This is another feature not possible with standard printed circuit board technology.

Note that the connector is not limited to a single thickness, as is common with those integrated as part of known printed circuit boards, but rather can be configured to have multiple thicknesses as may be needed or desired for a particular application. Thus, instead of a 1 mm thickness in accordance with MSA guidelines, the connector can be designed with a thickness greater or less than this.

As mentioned above, it is important in certain applications for the connector dimensions to fall within strict MSA-defined tolerances. One of these tolerances involves the distance between selected conductive features on the connector surface and an outer connector edge. In order to ensure this tolerance is met, the contact pads 130, traces 134, and other conductive features must be accurately placed on the connector surfaces during the laser structuring process. This is achieved via the use of references features, examples of which are shown in FIGS. 2A and 2B at 148.

Though illustrated as depressions defined in the top connector surface 50A, the reference features 148 can be one or more of a number of features that can be visually identified by the visual reference system of the laser etching apparatus that defines the locations for the conductive features on the connector surface. Examples of such reference features include a hole, ridge, nub, a corner of the piece, etc. Visual identification by the laser etching apparatus of the reference features 148 allows an accurate x-y reference plane to be determined with respect to the connector surface, thereby allowing for precise application of the conductive features on the connector surface within the strict tolerances defined by applicable MSAs. Other dimensions that can be defined by the present connector within tolerance, which according to some MSAs is about 0.1 mm, include the overall width and thickness of the connector. It is appreciated that other reference systems can also be employed to ensure formation of the connector within tolerance.

Reference is now made to FIG. 4, which illustrates one embodiment of an electrical interconnect for electrically interconnecting the traces 134 of the connector 50 with adjacent and corresponding traces 136 of the PCB 60 when the connector is mated with the PCB, as shown in FIG. 2B. In particular, a wirebond 150 can be attached to both traces 134 and 136, thereby establishing electrical interconnection therebetween so as to enable the transfer of electrical signals. In addition, other interconnecting schemes can be employed to establish electrical interconnection between the connector and the PCB. Note that wirebond 150 may also function as an interconnection mechanism configured to connect the edge connector 50 with the PCB 60.

FIG. 5 illustrates another interconnection mechanism configured to connect the edge connector 50 with the PCB 60, wherein attachment bars 154 are fixedly secured to both the connector and PCB across the mating interface therebetween. The attachment bars 154 may be employed on both the top and bottom surfaces of the mating interface to ensure a secure attachment between the connector 50 and the PCB 60. The attachment bars 154 may also function as an electrical interconnect for electrically interconnecting the traces 134 of the connector 50 with adjacent and corresponding traces 136 of the PCB 60 when the connector is mated with the PCB.

One alternative interconnection mechanism configured to connect the edge connector 50 with the PCB 60 is shown in FIG. 6, wherein bonding locations 160 are defined on both the vertical edge of the first end 52 (not shown here) of the connector 50 and the corresponding vertical edge of the PCB 60. An adhesive suitable for bonding the two components together at the bonding locations 160 is then employed to secure the attachment therebetween.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An edge connector suitable for attachment with a printed circuit board, comprising:
   a body composed of a plastic resin, the body defining a first end that is configured to operably attach to a portion of a printed circuit board and a second end configured to operably connect to a slot in a host device;
   a plurality of conductive traces and contact pads defined on a portion of a surface of the body, the traces being configured to electrically connect with corresponding traces defined on the printed circuit board; and
   a component pocket configured to receive an electrical component, wherein the component pocket is sunken with respect to surface of the body such that the electrical component is positioned substantially level with a surface of the body when placed in the component pocket and wherein the component pocket includes one or more conductive pads for electrically coupling the electrical component with one or more of the conductive traces defined on the surface.

2. The edge connector in accordance with claim 1, wherein the surface portion whereon the traces and contact pads are defined has been previously laser etched.

3. The edge connector in accordance with claim 1, wherein the body is injection molded and wherein the plastic resin contains a palladium catalyst.

4. The edge connector in accordance with claim 1, wherein the plurality of conductive traces are defined on a portion of a top body surface and a portion of a bottom body surface, further comprising:
   a via defined through the body so as to extend from the top surface to the bottom surface, wherein the via is configured to allow signals transmitted on the plurality of conductive traces to be transferred from one body surface to the other body surface.

5. The edge connector in accordance with claim 1, further comprising:
   one or more substantially vertical ridges configured to have conductive traces defined on opposing sides of the ridges such that effective impedance is defined between the traces.

6. The edge connector in accordance with claim 1, further comprising:
   one or more of the plurality of traces passing around one or more edges of the edge connector.

7. The edge connector in accordance with claim 1, further comprising:
   at least two reference features defined by the body, the reference features for use in defining the conductive traces and pads on a portion of the body surface.

8. The edge connector in accordance with claim 1, wherein the edge connector is implemented in an optical transceiver.

9. An edge connector suitable for attachment with a printed circuit board, comprising:
   a body composed of a plastic resin, the body defining a first end that is configured to operably attach to a portion of a printed circuit board and a second end configured to operably connect to a slot in a host device;
   a plurality of conductive traces and contact pads defined on a portion of a surface of the body, the traces being configured to electrically connect with corresponding traces defined on the printed circuit board;
   one or more substantially vertical ridges configured to have conductive traces defined on opposing sides of the ridges such that effective impedance is defined between the traces; and
   one or more troughs defined on a top surface of the edge connector, wherein the one or more troughs are configured to allow the one or more substantially vertical ridges to extend into the body of the edge connector is such as way as to not exceed a predetermined height.

10. An edge connector suitable for attachment with a printed circuit board, comprising:
    a body composed of a plastic resin, the body defining a first end that is configured to operably attach to a portion of a printed circuit board and a second end configured to operably connect to a slot in a host device;
    a plurality of conductive traces and contact pads defined on a portion of a surface of the body, the traces being configured to electrically connect with corresponding traces defined on the printed circuit board;
    at least one interconnection mechanism defined in the first end configured to connect the edge connector with the printed circuit board; and
    an electrical interconnect configured to electrically interconnect the plurality of conductive traces with a plurality of conductive traces located on a portion of the printed circuit board when the first end of the body is to be attached to the printed circuit board, wherein the at least one electrical interconnect comprises a wirebond configured to attach to the plurality of conductive traces of the edge connector and the plurality of conductive traces of the printed circuit board.

11. The edge connector in accordance with claim 10, wherein the body is injection molded and wherein the plastic resin contains a palladium catalyst.

12. The edge connector in accordance with claim 10, wherein the at least one interconnection mechanism comprises one or more attachment bars configured to be fixedly secured to both the edge connector and the printed circuit board across the mating interface therebetween.

13. The edge connector in accordance with claim 10, wherein the at least one interconnection mechanism comprises one or more bonding edges configured to mate with corresponding bonding edges of the printed circuit board, the bonding edges configured to receive an adhesive.

* * * * *